April 21, 1970 M. F. EISENBERG 3,508,162
MEANS FOR LIMITING CURRENT IN A POWER SUPPLY AMPLIFIER
Filed June 5, 1968
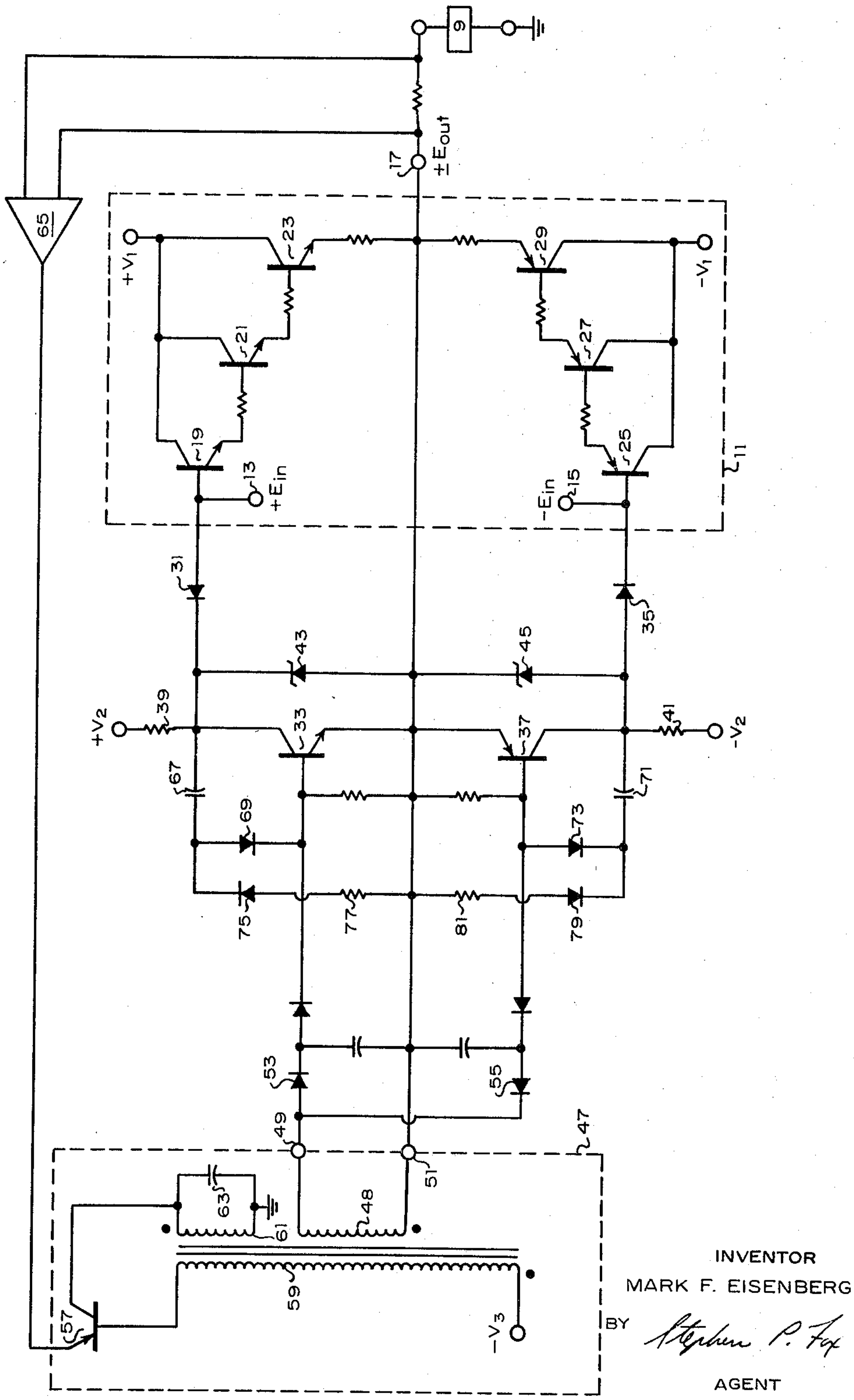
INVENTOR
MARK F. EISENBERG
BY Stephen P. Fox
AGENT United States Patent Office 3,508,162
Patented Apr. 21, 1970

3,508,162
MEANS FOR LIMITING CURRENT IN A POWER SUPPLY AMPLIFIER

Mark F. Eisenberg, North Plainfield, N.J., assignor to Hewlett-Packard Company, Palo Alto, Calif., a corporation of California Filed June 5, 1968, Ser. No. 734,680
Int. Cl. H03f *1/34, 3/20, 3/26*
U.S. Cl. 330—11 4 Claims

ABSTRACT OF THE DISCLOSURE

Two transistors respectively provide low impedance current paths between the positive and negative signal inputs and the dual polarity output of a transistor power amplifier, thereby rendering the amplifier inoperative to protect it during an overload condition. The two transistors are controlled respectively by the rectified positive and negative components of a signal produced by an oscillator. The oscillator is energized by a sensing amplifier responsive to load current.

BACKGROUND OF THE INVENTION

The importance of protecting transistorized power amplifiers from overload conditions is well known. The transistors in the output stage of such amplifiers are particularly susceptible to burn out due to excessive steady state or transient currents produced by sudden changes in the load. The problem of protecting against excess current is compounded in dual polarity power amplifiers wherein separate cascaded transistor stages respectively amplify the positive and negative signals, which are applied directly to the load from the electrodes of the output transistors. The overload protection circuitry should preferably have a fast response time without producing harmful transients which may damage the amplifier transistors. Additionally, in the case of a dual polarity amplifier, the circuitry must operate to protect both the positive and negative signal amplifying stages simultaneously.

SUMMARY OF THE INVENTION

The present invention, in one specific embodiment, comprises two transistors connected respectively between the positive and negative input terminals and the common output terminal of a transistor power amplifier which produces a dual polarity output. The two transistors operate to effectively shunt the two amplifier inputs to the output when an overload condition exists, thereby preventing damage to the amplifier. The two transistors are biased into conduction simultaneously by the rectified positive and negative components of signal generated by an oscillator having its output isolated from the supply potentials for the power amplifier. Load current sensing means energizes the oscillator, and thus the two transistors, when load current exceeds a predetermined value. Capacitor delay means gradually decrease the conduction of the two transistors to prevent undesirable switching transients. Capacitor discharge means insure fast response time of the protection circuitry.

BRIEF DESCRIPTION OF THE DRAWING

The single figure of the drawing is a combined schematic and block diagram illustrating the preferred embodiment of the invention.

DESCRIPTION OF THE PREFERRED EMBODIMENT

Referring to the figure, there is shown a transistor power amplifier 11 having a pair of input terminals 13, 15 for respectively receiving positive and negative input signals $+E_{IN}$, $-E_{IN}$, and a common output terminal 17 which supplies a dual polarity signal, $\pm E_{OUT}$, to a load 9. The power amplifier 11 may assume any one of a wide variety of configurations; however, in the illustrated embodiment, it is a push pull amplifier comprising two sets of cascaded transistors 19, 21, 23 and 25, 27, 29, each set of which is arranged in a Darlington compound connection. The two output transistors 23, 29 are of opposite conductivity type and are connected in a complementary symmetry configuration to the output terminal 17. The two input terminals 13, 15 may be driven separately, or they may be connected together through suitable biasing diodes, not shown, and driven from a signal source having a single output.

The input terminal 13 of power amplifier 11 is connected through a diode 31 and the collector-emitter current path of a switching transistor 33 to the common output terminal 17. Similarly, input terminal 15 is connected through a diode 35 and a switching transistor 37 to the output terminal 17. During normal operation of the power amplifier 11, the two switching transistors 33, 37 are maintained non-conducting; however, if an overload condition develops at the amplifier output, these two switching transistors are caused to conduct by load current sensing circuitry and control circuitry, hereinafter described. When transistors 33, 37 conduct, they provide low impedance current paths between input terminals 13, 15 and output terminal 17 and permit only a few tenths of a volt to develop across the three base-emitter junctions of each set of amplifier transistors 19, 21, 23 and 25, 27, 29. Thus, the amplifier transistors are biased off and are protected from excessive currents. Also, when switching transistors 33, 37 are conducting, the impedance reflected to the output terminal 17 is equal to the combination of the input impedances to terminals 13, 15 and the values of two resistors 39, 41 connected between the collector electrodes of transistors 33, 37 and their respective voltage sources $+V_2$ and $-V_2$. The two diodes 31, 35 function to prevent these voltage sources from affecting the bias applied to the amplifier input transistors 19, 25. There are also provided two Zener diodes 43, 45 connected across transistors 33, 37, respectively, for limiting the voltage across these transistors when they are non-conducting.

Transistors 33, 37 are simultaneously biased on by the rectified positive and negative components of a signal generated by an oscillator 47. Specifically, oscillator 47 includes an output winding 48 having a pair of end terminals 49, 51, the latter of which is connected to the common output terminal 17 and the emitters of switching transistors 33, 37. The other end terminal 49 is connected to two rectifying diodes 53, 55 which are poled opposite to one another so as to conduct respectively on the positive and negative one-half cycles of the signal output from the oscillator. The rectified positive and negative signal components are suitably filtered and applied respectively to the base electrodes of switching transistors 33, 37.

The oscillator circuit 47 includes a transistor 57 and a transformer having a primary winding 59, a positive feedback winding 61, and the previously described output winding 48. The base of transistor 57 is connected through primary winding 59 to a source of negative potential $-V_3$, and the collector of this transistor is connected through feedback winding 61 to ground. The oscillator output frequency depends on the inductance of the feedback coupling and the value of a capacitor 63 which is connected across the feedback winding 61.

Oscillator 47 is energized by an amplifier or current gate 65 having its output connected to the emitter of transistor 57. Current gate 65 is responsive to the signal developed across a current sampling resistor 67 which has a low value on the order of .1 ohm and is connected in series between the power amplifier output terminal 17 and the load 9. The current gate 65 is adjusted to energize oscillator 47 when the load current exceeds a predetermined level. The rectified output from oscillator 47 biases the two switching transistors 33, 37 into conduction, thereby rendering the power amplifier 11 inoperative during an overload condition.

In order to prevent current and voltage transients which might damage the power amplifier or the overload protection circuitry, the control means for the two switching transistors 33, 37 includes delay means for gradually decreasing conduction of these transistors when they are biased toward non-conduction. Specifically, a capacitor 67 and a diode 69 are connected in series between the collector and base electrodes of transistor 33. Similarly, a capacitor 71 and a diode 73 are connected in series between the collector and base electrodes of transistor 37. In operation, discharge circuitry, hereinafter described, maintains capacitors 67, 71 uncharged when transistors 33, 37 are conducting. When these transistors are biased toward non-conduction, each capacitor slowly charges through the base-emitter junction of its corresponding switching transistor. The transition time from conduction to non-conduction depends on the values of the capacitors 67, 71 and may be 100 $\mu$sec., for example.

To minimize the turn on time of switching transistors 33, 37, there are provided means for rapidly discharging the capacitors 67, 71 when these transistors are initially energized. Specifically, a diode 75 and a resistor 77 are connected in series between the emitter of transistor 33 and the junction of capacitor 67 and diode 69. Similarly a diode 79 and a resistor 81 provide a discharge path for capacitor 71.

What is claimed is:

1. A circuit for protecting against current overloads in a transistor power amplifier having two input terminals for respectively receiving positive and negative signals referenced to ground, and a common output terminal for providing amplified positive and negative signals to a load, said overload current protection circuit comprising:

two transistors respectively having base, emitter and collector electrodes, said emitter electrodes each being connected to the common output terminal of said power amplifier, and said collector electrodes being coupled respectively to said positive and negative amplifier input terminals, said transistors being of opposite conductivity type and poled to permit a low impedance current path between each of said positive and negative input terminals and said common output terminal;

means for controlling said two transistors independently of said ground reference, said control means including oscillator means for generating an output signal having positive and negative components, said oscillator means having two output terminals, one of said two output terminals being connected to the common output terminal of said power amplifier;

first and second means connected to the other one of said oscillator output terminals for rectifying said positive and negative signal components, respectively;

means for respectively coupling the rectified positive and negative signals from said first and second rectifying means to the corresponding base electrodes of said two transistors to simultaneously bias said two transistors into conduction; and means for energizing said oscillator means when the current through said load exceeds a predetermined value.

2. The circuit of claim 1, said means for controlling said two transistors further including:

first and second delay means for respectively gradually decreasing the conduction of said two transistors to prevent transient voltages and currents, said first and second delay means each including a diode and a capacitor connected in series between the collector and base electrodes of the corresponding one of said two transistors; and first and second capacitor discharge means for minimizing the turn on time of said two transistors, respectively, each of said discharge means including a diode and a resistor connected in series between the common output terminal of said power amplifier and the diode-capacitor junction of the corresponding one of said first and second delay means.

3. The circuit of claim 1, said oscillator means including:

an oscillator transistor having base, emitter and collector electrodes, said emitter electrode being connected to said means for energizing said oscillator means;

a transformer having a primary winding, a feedback winding, and an output winding, each of said windings having two end terminals;

said primary winding having one end terminal connectable to a source of bias potential and the other end terminal connected to the base electrode of said oscillator transistor;

said feedback winding having one end terminal connectable to a source of reference potential and the other end terminal connected to the collector electrode of said oscillator transistor;

said output winding having its two end terminals connected respectively to said two oscillator output terminals; and a capacitor connected in parallel with said feedback winding.

4. The circuit of claim 3, said means for energizing said oscillator means including:

resistor means for sampling current flow through said load; and sensing amplifier means for gating current to the emitter electrode of said oscillator transistor when the current flow through said sampling resistors exceeds a predetermined value.

References Cited

UNITED STATES PATENTS

| | | | |
|---|---|---|---|
| 2,980,845 | 4/1961 | Thompson et al. | 307—202 X |
| 3,448,394 | 6/1969 | Rheaume | 307—202 X |

NATHAN KAUFMAN, Primary Examiner

U.S. Cl. X.R.

307—202; 330—14, 15, 17, 24, 26